(12) United States Patent
Boughton

(10) Patent No.: US 9,550,694 B2
(45) Date of Patent: Jan. 24, 2017

(54) METHODS AND APPARATUS FOR MATERIAL PROCESSING USING PLASMA THERMAL SOURCE

(71) Applicant: Corning Incorporated, Corning, NY (US)

(72) Inventor: Daniel Robert Boughton, Rushville, NY (US)

(73) Assignee: Corning Incorporated, Corning, NY (US)

( * ) Notice: Subject to any disclaimer, the term of this patent is extended or adjusted under 35 U.S.C. 154(b) by 94 days.

(21) Appl. No.: 14/231,008

(22) Filed: Mar. 31, 2014

(65) Prior Publication Data

US 2015/0274567 A1 Oct. 1, 2015

(51) Int. Cl.
| | |
|---|---|
| C03B 5/02 | (2006.01) |
| C03B 3/00 | (2006.01) |
| C03B 5/185 | (2006.01) |
| C03B 19/10 | (2006.01) |
| H05H 1/24 | (2006.01) |
| H05H 1/46 | (2006.01) |

(52) U.S. Cl.
CPC ............ C03B 19/109 (2013.01); C03B 5/025 (2013.01); H05H 1/2406 (2013.01); *H05H 2001/2456* (2013.01); *H05H 2001/4675* (2013.01); *H05H 2001/4682* (2013.01)

(58) Field of Classification Search
None
See application file for complete search history.

(56) References Cited

U.S. PATENT DOCUMENTS

| | | |
|---|---|---|
| 1,476,432 A | 12/1923 | Troutman et al. |
| 3,937,625 A | 2/1976 | Stewart |
| 4,082,694 A | 4/1978 | Wennerberg et al. |

(Continued)

FOREIGN PATENT DOCUMENTS

| | | |
|---|---|---|
| CN | 1248248 | 3/2006 |
| CN | 101767202 | 7/2010 |

(Continued)

OTHER PUBLICATIONS

M. Boulos, "Plasma Power can make better powders", *Metal Powder Report*, May 2014, pp. 16-21.

(Continued)

*Primary Examiner* — Lisa Herring
(74) *Attorney, Agent, or Firm* — Jason A. Barron; Matthew B. Dernier

(57) ABSTRACT

Methods and apparatus provide for: feeding glass batch material into a plasma containment vessel in such a way that the glass batch material is dispensed as a sheet of glass batch material particles; directing one or more sources of plasma gas into the inner volume of the plasma containment vessel in such a way that the plasma gas enters the plasma containment vessel as at least one sheet of plasma gas; and applying an alternating electric field to facilitate production of a plasma plume within the inner volume of the plasma containment vessel, where the plasma plume is of dimensions sufficient to envelope the sheet of glass batch material particles, and is of sufficient thermal energy to cause the glass batch material to react and melt thereby forming substantially homogeneous, spheroid-shaped glass intermediate particles.

15 Claims, 7 Drawing Sheets

(56) References Cited

U.S. PATENT DOCUMENTS

| | | |
|---|---|---|
| 4,318,712 A | 3/1982 | Lang et al. |
| 5,081,397 A | 1/1992 | Liang et al. |
| 5,238,888 A | 8/1993 | Abe |
| 5,403,453 A | 4/1995 | Roth et al. |
| 5,414,324 A | 5/1995 | Roth et al. |
| 5,421,891 A | 6/1995 | Campbell et al. |
| 5,456,972 A | 10/1995 | Roth et al. |
| 5,527,518 A | 6/1996 | Lynum et al. |
| 5,669,583 A | 9/1997 | Roth |
| 5,711,664 A | 1/1998 | Jegou et al. |
| 5,734,143 A | 3/1998 | Kawase et al. |
| 5,750,822 A | 5/1998 | Gotovchikov et al. |
| 5,938,854 A | 8/1999 | Roth |
| 6,042,370 A | 3/2000 | Weide |
| 6,053,013 A | 4/2000 | Oh et al. |
| 6,348,126 B1 | 2/2002 | Hanawa et al. |
| 6,351,075 B1 * | 2/2002 | Barankova .......... H01J 37/3266 118/723 MA |
| 6,410,449 B1 | 6/2002 | Hanawa et al. |
| 6,417,625 B1 | 7/2002 | Brooks et al. |
| 6,428,600 B1 | 8/2002 | Flurschutz et al. |
| 6,453,842 B1 | 9/2002 | Hanawa et al. |
| 6,468,388 B1 | 10/2002 | Hanawa et al. |
| 6,494,986 B1 | 12/2002 | Hanawa et al. |
| 6,551,446 B1 | 4/2003 | Hanawa et al. |
| 6,893,907 B2 | 5/2005 | Maydan et al. |
| 6,919,527 B2 | 7/2005 | Boulos et al. |
| 6,939,434 B2 | 9/2005 | Collins et al. |
| 7,037,813 B2 | 5/2006 | Collins et al. |
| 7,094,316 B1 | 8/2006 | Hanawa et al. |
| 7,094,670 B2 | 8/2006 | Collins et al. |
| 7,137,354 B2 | 11/2006 | Collins et al. |
| 7,166,524 B2 | 1/2007 | Al-Bayati et al. |
| 7,183,177 B2 | 2/2007 | Al-Bayati et al. |
| 7,223,676 B2 | 5/2007 | Hanawa et al. |
| 7,264,688 B1 | 9/2007 | Paterson et al. |
| 7,288,491 B2 | 10/2007 | Collins et al. |
| 7,291,545 B2 | 11/2007 | Collins et al. |
| 7,294,563 B2 | 11/2007 | Al-Bayati et al. |
| 7,303,982 B2 | 12/2007 | Collins et al. |
| 7,320,734 B2 | 1/2008 | Collins et al. |
| 7,393,765 B2 | 7/2008 | Hanawa et al. |
| 7,430,984 B2 | 10/2008 | Hanawa et al. |
| 7,465,478 B2 | 12/2008 | Collins et al. |
| 7,479,456 B2 | 1/2009 | Buchberger, Jr. et al. |
| 7,622,693 B2 | 11/2009 | Foret |
| 7,642,180 B2 | 1/2010 | Al-Bayati et al. |
| 7,665,407 B2 | 2/2010 | Hwang et al. |
| 7,700,465 B2 | 4/2010 | Collins et al. |
| 7,709,415 B2 | 5/2010 | Sugo et al. |
| 7,743,730 B2 | 6/2010 | Kholodenko et al. |
| 7,867,366 B1 | 1/2011 | McFarland et al. |
| 7,951,749 B2 | 5/2011 | Yang et al. |
| 8,002,992 B2 | 8/2011 | Foret |
| 8,076,258 B1 | 12/2011 | Biberger |
| 8,318,356 B2 | 11/2012 | Gadkaree et al. |
| 8,324,523 B2 | 12/2012 | Foret |
| 8,357,873 B2 | 1/2013 | Foret |
| 8,361,404 B2 | 1/2013 | Gutsol et al. |
| 8,366,925 B2 | 2/2013 | Foret |
| 8,784,764 B2 | 7/2014 | Gadkaree et al. |
| 8,883,110 B2 | 11/2014 | Ueda |
| 9,284,210 B2 | 3/2016 | Boughton |
| 2003/0027054 A1 | 2/2003 | Ball et al. |
| 2003/0047449 A1 | 3/2003 | Hanawa et al. |
| 2003/0226641 A1 | 12/2003 | Collins et al. |
| 2004/0012319 A1 | 1/2004 | Shun'Ko |
| 2004/0050098 A1 | 3/2004 | Ball et al. |
| 2004/0107906 A1 | 6/2004 | Collins et al. |
| 2004/0107907 A1 | 6/2004 | Collins et al. |
| 2004/0107908 A1 | 6/2004 | Collins et al. |
| 2004/0107909 A1 | 6/2004 | Collins et al. |
| 2004/0112542 A1 | 6/2004 | Collins et al. |
| 2004/0149217 A1 | 8/2004 | Collins et al. |
| 2004/0149218 A1 | 8/2004 | Collins et al. |
| 2004/0166612 A1 | 8/2004 | Maydan et al. |
| 2004/0200417 A1 | 10/2004 | Hanawa et al. |
| 2004/0238345 A1 | 12/2004 | Koulik et al. |
| 2005/0016456 A1 | 1/2005 | Taguchi et al. |
| 2005/0051271 A1 | 3/2005 | Collins et al. |
| 2005/0051272 A1 | 3/2005 | Collins et al. |
| 2005/0070073 A1 | 3/2005 | Al-Bayati et al. |
| 2005/0136604 A1 | 6/2005 | Al-Bayati et al. |
| 2005/0191827 A1 | 9/2005 | Collins et al. |
| 2005/0191828 A1 | 9/2005 | Al-Bayati et al. |
| 2005/0191830 A1 | 9/2005 | Collins et al. |
| 2005/0230047 A1 | 10/2005 | Collins et al. |
| 2006/0043065 A1 | 3/2006 | Buchberger, Jr. et al. |
| 2006/0073683 A1 | 4/2006 | Collins et al. |
| 2006/0081558 A1 | 4/2006 | Collins et al. |
| 2007/0042580 A1 | 2/2007 | Al-Bayati et al. |
| 2007/0075051 A1 | 4/2007 | Morrisroe |
| 2007/0119546 A1 | 5/2007 | Collins et al. |
| 2007/0137573 A1 | 6/2007 | Kholodenko et al. |
| 2007/0175241 A1 | 8/2007 | Delamielleure et al. |
| 2007/0212811 A1 | 9/2007 | Hanawa et al. |
| 2007/0235419 A1 | 10/2007 | Kong et al. |
| 2008/0044960 A1 | 2/2008 | Al-Bayati et al. |
| 2008/0145553 A1 | 6/2008 | Boulos et al. |
| 2008/0173641 A1 | 7/2008 | Hadidi et al. |
| 2009/0064716 A1 | 3/2009 | Sakamoto et al. |
| 2009/0149028 A1 | 6/2009 | Marakhtanov et al. |
| 2009/0188898 A1 | 7/2009 | Kong et al. |
| 2010/0044477 A1 | 2/2010 | Foret |
| 2010/0074807 A1 | 3/2010 | Bulkin et al. |
| 2010/0199721 A1 | 8/2010 | Antoine et al. |
| 2011/0097901 A1 | 4/2011 | Banna et al. |
| 2011/0140607 A1 | 6/2011 | Moore et al. |
| 2011/0201492 A1 | 8/2011 | Yang et al. |
| 2011/0260732 A1 | 10/2011 | Shinada et al. |
| 2011/0298376 A1 | 12/2011 | Kanegae et al. |
| 2011/0300029 A1 | 12/2011 | Foret |
| 2011/0316551 A1 | 12/2011 | Shinada et al. |
| 2011/0316552 A1 | 12/2011 | Shinada et al. |
| 2012/0125052 A1 | 5/2012 | Dong et al. |
| 2012/0187844 A1 | 7/2012 | Hoffman et al. |
| 2012/0321527 A1 | 12/2012 | Gutsol et al. |
| 2012/0321895 A1 | 12/2012 | Ueda |
| 2013/0118589 A1 | 5/2013 | Hu et al. |
| 2013/0126332 A1 | 5/2013 | Foret |
| 2013/0126485 A1 | 5/2013 | Foret |
| 2014/0000316 A1 | 1/2014 | Coggin, Jr. |
| 2014/0291302 A1 | 10/2014 | Morrisroe |
| 2014/0332506 A1 | 11/2014 | Morrisroe |
| 2015/0274566 A1 | 10/2015 | Boughton |
| 2015/0274567 A1 | 10/2015 | Boughton |
| 2016/0029472 A1 | 1/2016 | Jevtic et al. |

FOREIGN PATENT DOCUMENTS

| | | | |
|---|---|---|---|
| CN | 202310265 | 7/2012 | |
| EP | 1 831 425 | 7/2011 | |
| EP | 2 424 336 | 2/2012 | |
| EP | 2 256 781 | 12/2012 | |
| FR | 2629573 | 10/1989 | |
| GB | 2196956 | 5/1988 | |
| JP | 03-064182 | 5/2000 | |
| JP | 2002191972 | 7/2002 | |
| JP | 2003212572 | 7/2003 | |
| JP | 2004124231 | 4/2004 | |
| JP | 2004225135 | 8/2004 | |
| JP | 2004338991 | 12/2004 | |
| JP | 03639279 | 1/2005 | |
| JP | 2008202804 | 9/2008 | |
| JP | 04239145 | 1/2009 | |
| JP | 2013082591 | 5/2013 | |
| JP | 2013112540 | 6/2013 | |
| JP | 2013112571 A * | 6/2013 | |
| KR | 2003008166 | 1/2003 | |
| NL | 2424336 A1 * | 2/2012 | ........... H05H 1/2406 |
| WO | 0139560 | 5/2001 | |
| WO | 2006/078340 | 7/2006 | |
| WO | 2009043001 | 4/2009 | |
| WO | 2012026819 | 3/2012 | |

(56) References Cited

FOREIGN PATENT DOCUMENTS

| WO | 2012043484 | 4/2012 |
|---|---|---|
| WO | 2012103101 | 8/2012 |
| WO | 2015013173 | 1/2015 |
| WO | 2015050803 | 4/2015 |

OTHER PUBLICATIONS

D. Kurniawan, et al., "Plasma Polymerization of Basalt Fiber/Polylactic Acid Composites: Effects on Mechanical Properties", 18$^{th}$ *International Conference on Composite Materials*, pp. 1-4.
J. Laimer, et al., "Characterization of an Atmospheric Pressure Radio-Frequency Capacitive Plasma Jet", *Plasma Processes and Polymers*, 2007, vol. 4, pp. S487-S492.
J. Laimer, et al., "Investigation of an atmospheric pressure radio-frequency capacitive plasma jet", *Vacuum Surface Engineering, Surface Instrumentation & Vacuum Technology*, 2005, vol. 79, pp. 209-214.
J. Park, et al., "Discharge phenomena of an atmospheric pressure radio-frequency capacitive plasma source", *Journal of Applied Physics*, Jan. 1, 2001, vol. 89, No. 1, pp. 20-28.
J. Park, et al., "Gas breakdown in an atmospheric pressure radio-frequency capacitive plasma source", *Journal of Applied Physics*, Jan. 1, 2001, vol. 89, No. 1, pp. 15-19.
J.R. Roth, et al., "The physics and phenomenology of One Atmosphere Uniform Glow Discharge Plasma (OAUGDP™) reactors for surface treatment applications", *Journal of Physics D: Applied Physics*, 2005, vol. 38, pp. 555-567.
J.R. Roth, "Capacitive RF Electrical Discharges in Gases", *Industrial Plasma Engineering*, vol. 1, Copyright IOP Publishing Ltd 1995, Principles, pp. 440-461.
J.R. Roth, "Atmospheric Dielectric Barrier Discharges (DBDS)", *Industrial Plasma Engineering*, vol. 2, Copyright IOP Publishing Ltd 2001, Applications to Nonthermal Plasma Processing, pp. 50-65.
J.H. Seo, et al., "Direct synthesis of nano-sized glass powders with spherical shape by RF (radio frequency) thermal plasma", *Thin Solid Films*, 2011, vol. 519, pp. 7111-7115.
JP2004338991 Abstract.
Ahmadpour et al; "The Preparation of Activated Carbon From Macadamia Nutshell by Chemical Activation" Carbon, vol. 35, No. 12, pp. 1723-1732 1997.
Ahmadpour et al; "The Preparation of Active Carbons From Coal by Chemical and Physical Activation"; Carbon, vol. 34, No. 4 pp. 471-479, 1996.
Al-Shamma et al., "Design and Construction of A 2.45 GHz Waveguide-Based Microwave Plasma Jet At Atmospheric Pressure for Material Processing", Journal of Physics D: Applied Physics, 2001, vol. 34, pp. 2734-2741.
Cadek et al; "Bio-Based Materials for Supercapacitor"; SGL Group—The Carbon Company, Meitingen Germany; 3 Pages.
Gupta et al; "Fluid Bed Technology in Materials Processing" Chapter 4.
Huang et al; "Contact Angle Analysis of Low-Temperature Cyclonic Atmospheric Pressure Plasma Modified Polyethylene Terephthalate," Thin Solid Films, vol. 518, Issue 13, pp. 3575-3580, 2010.
Illan-Gomez et al; "Acitvated Carbons From Spanish Coals. 2. Chemical Activation"; Energy and Fuels, 1996, 10, 1108-1114.
Kadlec et al; "Structure of Pores of Active Carbons Prepared by Water-Vapour and Zinc-Dichloride Activation"; Carbon, 1970, vol. 8, pp. 321-331.
Kawaguchi et al; "Challenge to Improve Glass Melting and Fining Process"; Ceramics—Silikaty 52 (4) 217-224 (2008).
Kurniawan et al.; "Atmospheric Pressure Glow Discharge Plasma Polymerization for Surface Treatment on Sized Basalt Fiber/Polylactic Acid Composites"; Composites: Part B 43 (2012) 1010-1014.
Lie, et al., "Characteristics of Gliding ARC Discharge Plasma", Plasma Science & Technology, Nov. 2006, vol. 8, No. 6, pp. 653-655.
Kurniawan et al., "Plasma Polymerization of Basalt Fiber/Polylactic Acid Composites: Effects on Mechanical Properties", 18th International Conference on Composite Materials, pp. 1-4.
Nemec et al; "Glass Melting and Its Innovation Potentials: Bubble Removal Under the Effect of the Centrifugal Force"; Ceramics—Silikaty 52 (4) 225-239 (2008).
Pandolfo et al; "Carbon Properties and Their Role in Supercapacitors"; Journal of Power Sources 157 (2006) 11-27.
Seo, et al,: "Radio Frequency Thermal Plasma Treatment for Size Reduction and Spheroidization of Glass Powders Used in Ceramic Electronic Devices"; J. AM. CERAM. SOC., 90 (6) 1717-1722 (2007).
Teng et al; "Preparation of Porous Carbons From Phenol-Formaldehyde Resins With Chemical and Physical Activation"; Carbon 38 (2000) 817-824.
Tennison et al; "Phenolic-Resin-Derived Activated Carbons"; Applied Catalysis A: General 173 (1998) 289-311.
Truesch et al; "Basic Properties of Specific Wood-Based Materials Carbonised in a Nitrogen Atmosphere"; Wood SCI Technol (2004) 38, 323-333.
Wylie, et al., "An Atmospheric Microwave Plasma Jet for Ceramic Material Processing", Journal of Materials Processing Technology, 2004, vols. 153-154, pp. 288-293.
Yan et al; "Spheroidization of Silica Powders in a Radio Frequency Plasma"; Institute of Process Engineering, Chinese Acaday of Sciences; 5 Pages.
Yao, et al., "An Innovative Energy-Saving In-Flight Melting Technology and Its Application to Glass Production", Science and Technology of Advanced Materials, 2008, vol. 9, pp. 1-8.
Yue et al; "Preparation of Fibrous Porous Materials by Chemical Activation 1. ZnCl2 Activation of Polymer-Coated Fibers"; Carbon 40 (2002) 1181-1191.
Yue et al; "Preparation of Fibrous Porous Materials by Chemical Activation 2. H3PO4 Activation of Polymer Coated Fibers"; Carbon 41 (2003) 1809-1817.
Roth, "Capacitive RF Electrical Discharges in Gases", Industrial Plasma Engineering, vol. 1, Copyright IOP Publishing LTD 1995, Principles, pp. 440-461.
International Search Report and Written Opinion PCT/US2015/022891 Dated Jun. 12, 2015.
International Search Report and Written Opinion PCT/US2015/022974 Dated Jun. 23, 2015.
International Search Report and Written Opinion PCT/US2015/022982 Dated Jun. 24, 2015.
International Search Report and Written Opinion PCT/US2016/012557 Dated Apr. 22, 2016.

* cited by examiner

METHODS AND APPARATUS FOR MATERIAL PROCESSING USING PLASMA THERMAL SOURCE

BACKGROUND

The present disclosure relates to methods and apparatus for material processing using a plasma thermal source.

Glass substrates may be used in a variety of applications, including windows, high-performance display devices, and any number of other applications. The quality requirements for glass substrates have become more stringent as the demand for improved resolution, clarity, and performance increases. Glass quality may, however, be negatively impacted by various processing steps, from forming the glass melt to final packaging of the glass product.

One processing step that may result in reduced glass quality is the melting process, wherein glass batch material are mixed and heated in a melting apparatus. During this process, the glass batch material melt and react, giving off reaction gases, which produce bubbles in the molten glass. Additionally, the melting process may produce an inhomogeneous glass melt having regions of differing chemical compositions. The first melt to form is often highly reactive with the refractory materials, which may lead to excessive wear of the apparatus and/or defects in the glass melt. Denser portions of the melt may also sink to the bottom of the melting apparatus, leading to a sludge layer, which has different optical properties than the rest of the melt and is difficult to completely mix back into the overall melt. The sludge layer therefore results in inhomogeneous portions of the melt, referred to in the art and herein as chord. Finally, due to typically large processing volumes, it is possible that various glass batch material may not completely melt. Any unmelted or partially melted materials are carried through the melting process and may later become defects in the glass product.

Current melting processes for producing high quality optical glass utilize high temperatures and stirring to remove bubbles from the glass melt. However, such processes may be cost prohibitive, as they require expensive metals and specially designed high temperature refractory materials for the processing equipment. Further, these costly melting systems require a long processing time and high energy expenditure as the reaction gases have a long distance to travel to escape the glass melt and the sludge layer must be mixed from the bottom of the melter tank into the rest of the glass melt in the tank, requiring a mixing motion over a long distance through a highly viscous fluid.

Alternative methods for preventing glass bubbles and inhomogeneous portions in the glass melt include processing the melt in smaller batches. In this manner, the gas bubbles have a shorter distance to travel to escape the melt and the sludge layer can be more easily incorporated into the rest of the melt. However, as with many small scale processes, these methods have various drawbacks such as increased processing time and expense.

Accordingly, there are needs in the art for techniques to improve the melting processes of glass batch material for producing high quality optical glass.

SUMMARY

The present disclosure relates to an area of material processing of materials (for example, glass batch material) by means of atmospheric thermal plasma in which the material to be processed is dispensed a as a planar, sheet-like form of material particles into a plasma plume that is of a planar, sheet-like configuration. In order to produce the plasma plume, an electromagnetic field is provided to plasma gas, such that the plasma plume attains an electron temperature of at least 9,000° K, for example, 11,603° K (which is $1.602 \times 10^{-19}$ J or 1 eV). The charged particles of the plasma gas are accelerated by the electromagnetic field in order to produce ionization and give momentum and kinetic energy to ions and electrons in the plasma gas. When the ions and electrons collide with the material (for example, glass batch material in powder form) the kinetic energy is transferred to the materials. The transfer of the kinetic energy raises the internal temperature of the materials to the point where they thermally react (for example, partially melt, fully melt, and/or cause some other or further reaction).

For commercial purposes, it is important that the atmospheric thermal plasma process exhibit high throughput and sufficient thermal energy to achieve the desired thermal reaction.

Inductively coupled plasma (ICP) systems have been used for low pressure sputtering and etching systems on substrates. Inductively coupled atmospheric plasma material processing systems are generally constructed with small diameter coils or microwave waveguides which limit the plasma to a small volumetric column (typically about 5 mm in diameter). Consequently, only a low rate of particulate material may be introduced into the plasma at any given time.

Capacitively coupled plasma (CCP) systems have been used for low pressure reactive processing, sputtering, PECVD processes, thin film PVD, etc. in which solid substrates are treated. Capacitively coupled plasma systems have also been used with concentric tubes acting as separate capacitor plates, which produce small columnar plasma volumes (again about 5 mm in diameter) and resultant low particulate material processing rates. An atmosphere uniform glow discharge plasma system has been employed in which a parallel capacitive plate arrangement produced atmospheric plasma, however, with essentially no heating as part of the process.

The embodiments disclosed herein overcome the low particulate material processing rates of existing systems in order to provide industrial scale applications. The embodiments provide high volumes of plasma at atmospheric pressures, and produce adequate kinetic energy within the plasma plume to heat the material and achieve desired reactions, including melting and/or other thermally-based processes.

Other aspects, features, and advantages will be apparent to one skilled in the art from the description herein taken in conjunction with the accompanying drawings.

DESCRIPTION OF THE DRAWINGS

For the purposes of illustration, there are forms shown in the drawings that are presently preferred, it being understood, however, that the embodiments disclosed and described herein are not limited to the precise arrangements and instrumentalities shown.

DETAILED DESCRIPTION OF THE PREFERRED EMBODIMENTS

Figure 1:
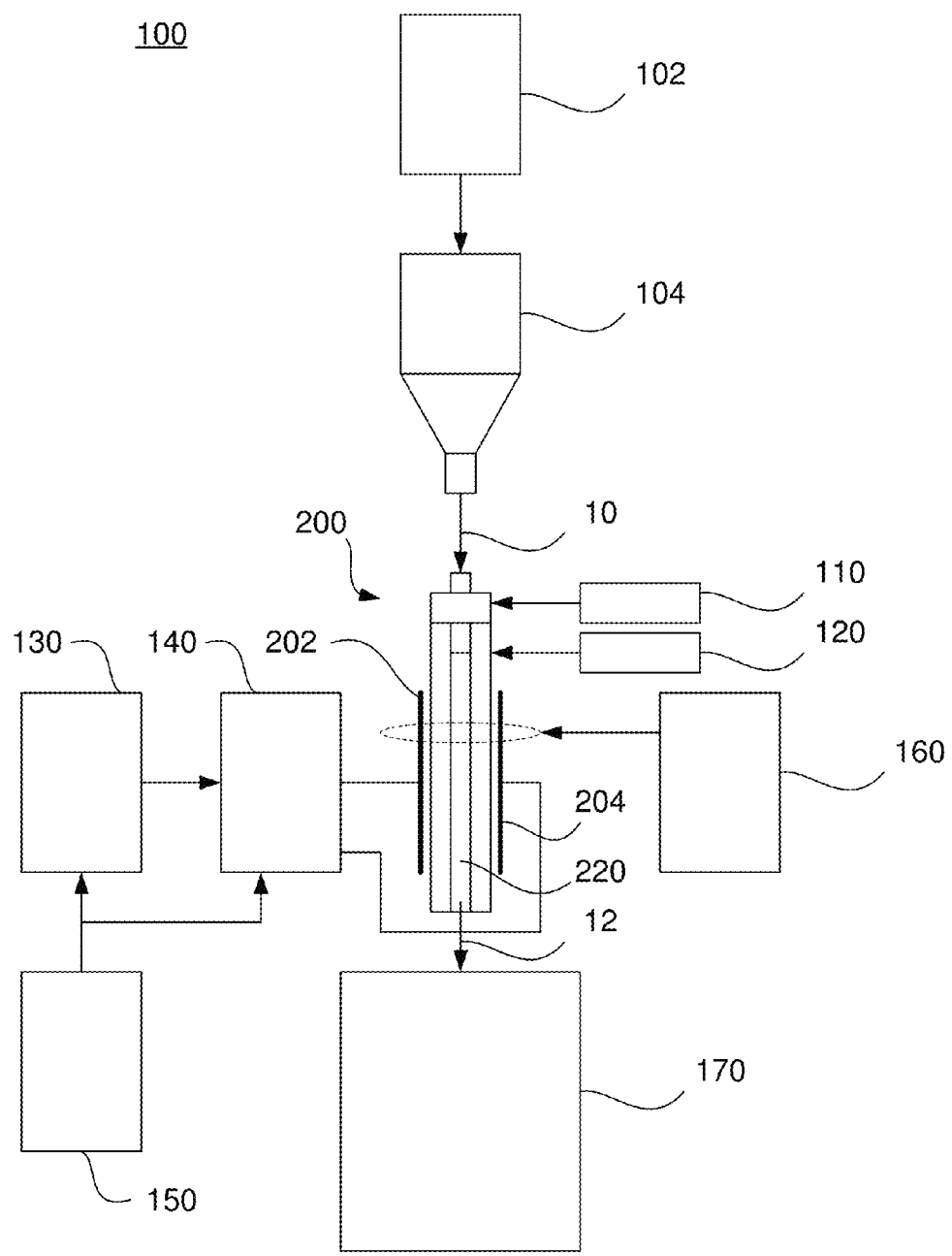
FIG. 1 is a schematic illustration of a system for melting glass batch material according to one or more embodiments of the present disclosure.

With reference to the drawings wherein like numerals indicate like elements there is shown in FIG. 1 a system 100 for processing material using a plasma thermal source. The material may be of a generally particulate form, and may be any suitable material, for example glass batch material.

The phrase glass batch material, and variations thereof, is used herein to denote a mixture of glass precursor particles which, upon melting, reacting and/or other action, combine to form a glass material. The glass batch material may be prepared and/or mixed by any known method for combining the glass precursor particles. For example, in certain non-limiting embodiments, the glass batch material comprises a dry or substantially dry mixture of glass precursor particles, e.g., without any solvent or liquid. In other embodiments, the glass batch material may be in the form of a slurry, for example, a mixture of glass precursor particles in the presence of a liquid or solvent. According to various embodiments, the glass batch material may comprise glass precursor materials, such as silica, alumina, and various additional oxides, such as boron, magnesium, calcium, sodium, strontium, tin, or titanium oxides. For instance, the glass batch material may be a mixture of silica and/or alumina with one or more additional oxides. One skilled in the art will appreciate that the glass batch material may take on a wide variety of specific combinations of compounds and substances.

Figure 2:
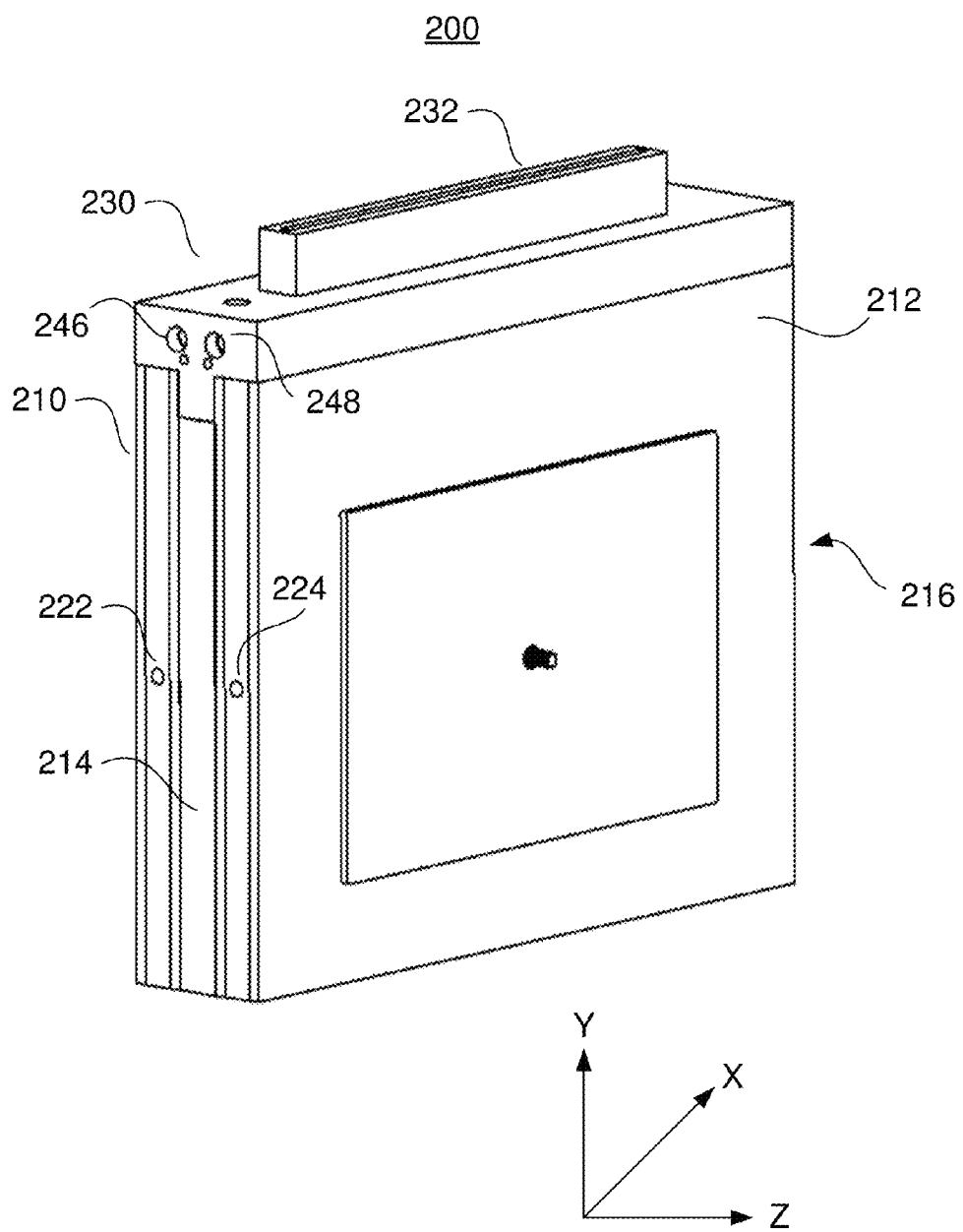
FIG. 2 is a perspective, and schematic illustration, of one or more embodiments of a plasma containment vessel usable in the system of FIG. 1 and/or other embodiments.
Figure 3:
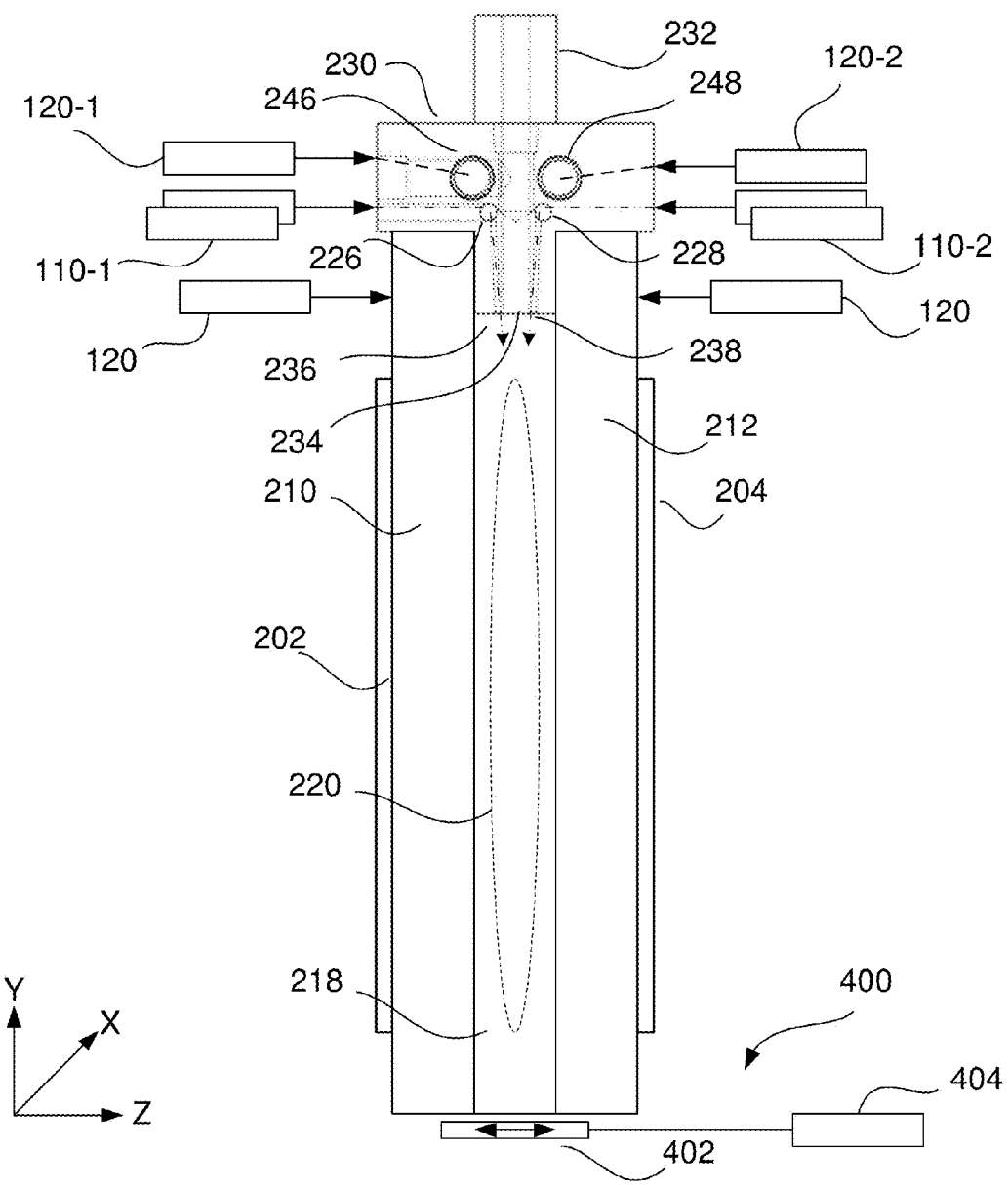
FIG. 3 is a side view of the plasma containment vessel of FIG. 2.
Figure 4:
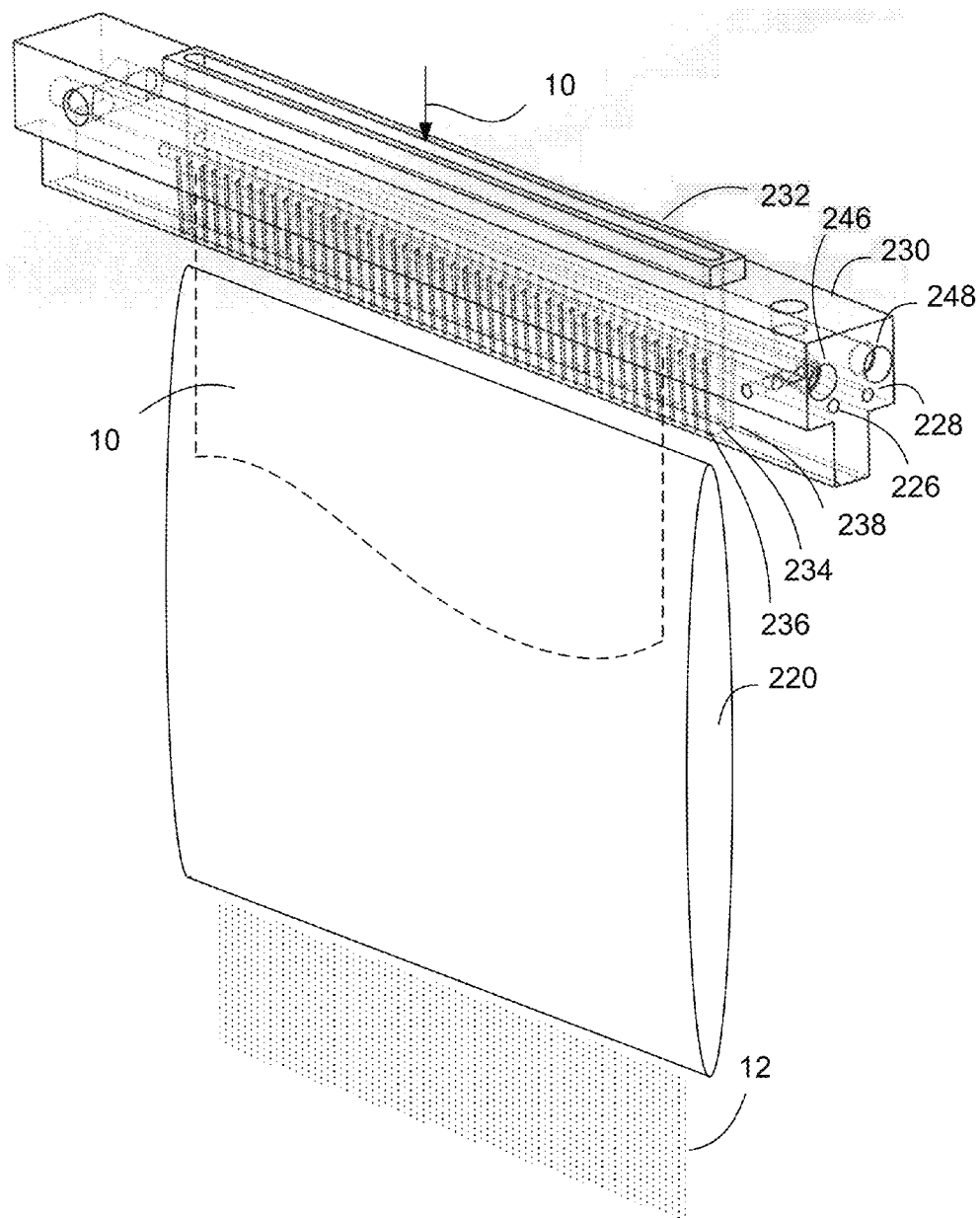
FIG. 4 is a perspective, partially transparent, and schematic illustration, of an an inlet structure suitable for use in implementing the plasma containment vessel of FIG. 2 and/or other embodiments.

A detailed discussion of the system 100 will now be provided with reference to FIGS. 1-4. FIG. 2 is a perspective, and schematic illustration, of one or more embodiments of the plasma containment vessel 200, where FIG. 3 is a side view thereof. FIG. 4 is a perspective, partially transparent, and schematic illustration, of an an inlet structure of the plasma containment vessel 200.

With reference to FIG. 1, the glass precursor particles may be introduced into a batch feeder and/or mixer 102, where the particles are mixed, followed by feeding the mixed particles into a batch sifter 104, where any agglomerates are broken up. The glass batch material 10 may have an average particle size ranging from about 5 to about 1,000 microns. The glass batch material 10 (the flow of which is illustrated the arrow labeled 10) leave the batch sifter 104 and enter a plasma containment vessel 200. The glass batch material 10 is exposed to a plasma plume 220 within the plasma containment vessel 200, whereby the plasma plume 220 is of sufficient thermal energy to cause at least a thermal reaction of the glass batch material 10 to produce thermally reacted glass batch material 12.

Examples of the types of thermal reactions contemplated herein include, at least one of: (i) at least partially melting the glass batch material 10 to produce the thermally reacted glass batch material 12, (ii) at least partially melting at least one of the glass batch material and one or more further materials thereby forming coated glass batch material particles 12, and (iii) at least partially melting the glass batch material to form substantially homogeneous, spheroid-shaped glass intermediate particles 12. Those skilled in the art will appreciate that the types of thermal reactions (and/or other reactions) within the plasma containment vessel 200 may include any number of additional reactions as would be evident from the state of the art.

In order to facilitate the plasma plume 220 within the plasma containment vessel 200 one or more sources of plasma gas 110 are coupled to the vessel 200. One or more sources of cooling fluid 120 (such as air, water, etc.) may also be coupled to the plasma containment vessel 200 in order to control the temperature of the structure in the presence of the plasma plume 220.

As will be described in greater detail herein, the plasma gas is subject to an electric field and a magnetic field. The electric field is produced by way of a RF power source 130, and an impedance matching network 140, which drive first and second electrodes 202, 204 to establish the electric field therebetween. A control unit 150 (such as a microprocessor operating under the influence of a software program) may provide signaling to the RF power source 130 and/or the impedance matching network 140 in order to properly set voltage, current, and frequency levels to the electrodes 202, 204. The magnetic field is produced by a magnetic source circuit 160. With proper orientations and magnitudes of the electric field and the magnetic field, the plasma plume 220 may achieve sufficient energy to cause the thermal reaction in the glass batch material 10.

The thermally reacted glass batch material 12 is accumulated in a collection vessel 170. After collection, the thermally reacted glass batch material 12 may be subjected to additional and/or optional processing steps.

With reference to FIGS. 2-4, the plasma containment vessel 200 includes first and second opposing wall members 210, 212 interconnected by opposing first and second side members 214, 216. The wall members 210, 212 and side members 214, 216 define an inner volume 218 in which the plasma plume 220 is maintained. The plasma containment vessel 200 includes an inlet end and an opposing outlet end separated from the inlet end in the Y direction.

The inner volume 218 includes X, Y, Z orthogonal dimensions (and directions), where in a preferred embodiment the volume is in the form of a right parallelepiped in which the Z dimension is substantially smaller than the X and Y dimensions. For example, the X and Y dimensions may be on the order of 200-300 mm each, while the Z dimension may be on the order of about 5-30 mm. Of course, variations in these dimensions are possible, although the desired effect is to have the inner volume 218 of suitable size and shape to facilitate the production of a three dimensional, planar, sheet-like plasma plume 220 (see FIG. 4). The definition of a three dimensional, planar sheet-like shape need not be perfectly rectilinear or perfectly geometric as shown in FIG. 4. Indeed, a practical plasma plume 220 will exhibit some non-uniformities dictated by natural law. Nevertheless, for the purposes of discussion, the general three-dimensional planar shape is desired in which two of the three dimensions are relatively larger than the third dimension. The advantageous affects of such a plasma plume 220 will be discussed in further detail later herein.

The first and second wall members 210, 212 and first and second side members 214, 216 may be formed from a suitable non-conductive, non-corrosive, high temperature, dielectric material, such as high temperature ceramic materials, quartz, preferably with an ultra-low coefficient of thermal expansion. In order to permit cooling of one or more components of the plasma containment vessel 200, one or more of the wall members 210, 212, 214, 216 may include one or more internal channels operating to carry cooling fluid therethrough. In this regard, the internal channels may be accessed via respective inlet/outlets 222, 224 that are in fluid communication with the one or more sources of cooling fluid 120.

The plasma containment vessel 200 may also include an inlet structure 230 disposed at the inlet end thereof. The basic purpose of the inlet structure 230 is to receive the glass batch material 10 from the supply, such as the batch sifter 104, and direct the material 10 into the inner volume of the plasma containment vessel 200 so that it may be enveloped by the plasma plume 220. The inlet structure 230 may be formed from any suitable material, such as a non-magnetic alloy, for example brass, copper, stainless steel, etc.

The inlet structure 230 may include a material inlet 232 for receiving the glass batch material 10, and an opposing material outlet 234 for material egress. The material inlet 232 and the material outlet 234 may be elongate (in the form of a slot) in the X direction such that the glass batch material 10 is dispensed into the inner volume 218 as a substantially planar, sheet-like accumulation of glass batch material particles 10 (see also FIG. 4). The material inlet 232 may be in the form of a flange or collar in order to mate with a conduit (not shown) of complimentary size and shape from the batch sifter 104 (or other supply).

The inlet structure 230 may also include at least one gas inlet for receiving plasma gas from the one or more sources of plasma gas 110. As will be discussed in more detail hereinbelow, the plasma gas may include at least one of argon, air, helium, nitrogen, oxygen, and mixtures thereof. In one or more embodiments, two gas inlets 226, 228 may be employed, where a first gas inlet 226 may receive one or more types of plasma gas from one or more first sources 110-1, and where a second gas inlet 228 may receive one or more types of plasma gas from one or more second sources 110-2. The inlet structure 230 may also include a plurality of gas outlets, disposed in proximity to the material outlet 234, for directing the plasma gas into the inner volume 218 of the plasma containment vessel 220.

In one or more embodiments, the plurality of gas outlets may include at least one group of gas outlets, such as first and second groups of gas outlets 236, 238. With reference to FIG. 4, in such a configuration, the elongate material outlet 234 may include at least first and second opposing peripheral edges extending in the X direction, and each gas outlet of the respective first and second groups of gas outlets 236, 238 may be disposed at intervals along at least one of such first and second opposing peripheral edges of the material outlet 234. For example, the gas outlets of the first group of gas outlets 236 may be arranged in line (in the X direction) along the first edge of the material outlet 234, and (if employed) the gas outlets of the second group of gas outlets 238 may be arranged in line (again in the X direction) along the second edge of the material outlet 234. As may be seen in FIG. 4, the above arrangement may be implemented, for example, by way of providing two parallel bores starting at the gas inlets 226, 228 and running through the inlet structure 230 in the X direction along respective sides of, and above, the material outlet 234. A plurality of passages (or tubes, or jets) of about 1.2 mm diameter (which may be of smaller diameter than the bores) may be directed generally in the Y direction from the respective bores to the respective gas outlets along the edges of the material outlet 234. The gas outlets may be disposed at any suitable pitch (preferably a maximum pitch), such as about every 4 mm along the length in the X direction. In this way, the gas outlets are operable to direct the plasma gas into the inner volume 218 of the plasma containment vessel 200 as at least one planar sheet of plasma gas, such as first and second planar sheets of plasma gas.

With reference to FIG. 3, in one or more embodiments, the plurality of gas outlets of a given group may be directed at an angle with respect to the Y direction, such as 10-20 degrees inwardly. Thus, when two planar sheets of plasma gas employed, they will be directed both in the Y direction and toward one another (inwardly in the Z direction) in order to envelop the planar sheet of glass batch material particles 10. The inwardly directed planar sheets of plasma gas are angled toward the glass batch material 10 with opposing forces, which then keep the material 10 generally in a center of the plasma plume 220 where a hottest temperature exists. The angled planar sheets of plasma gas also tend to keep the glass batch material 10 in the planar sheet (or linear curtain) orientation, spreading same out evenly as the glass batch material 10 falls through the plasma plume 220.

The inlet structure 230 may also include one or more internal channels operating to carry fluid therethrough in order to cool the inlet structure 230 in the presence of the plasma plume 220. In this regard, the internal channels may be accessed via respective inlet/outlets that are in fluid communication with the one or more sources of cooling fluid 120. For example, first and second cooling fluid inlets 246, 248 may receive cooling fluid from one or more sources of cooling fluid 120-1, 120-2. Among the available design options, the respective inlets 246, 248 may communicate with respective longitudinal bores extending in the X direction to respective outlets. The outlets permit egress of warmed fluid for recirculation back to the cooling fluid sources 120-1, 120-2 or disposal.

The plasma containment vessel 200 may also include first and second electrodes 202, 204 covering portions of respective exterior surfaces of the first and second wall members 210, 212. The first and second electrodes 202, 204 are formed from a conductive material, such as copper, which may be plated with another conductive material, such as silver, gold, etc. The first and second electrodes 202, 204 are preferably of a rectangular or square, plate-like configuration and are separated from one another by a distance in the Z direction established by the wall members 210, 212. The dimensions of the first and second electrodes 202, 204 are preferably somewhat smaller than the dimensions of the first and second wall members 210, 212 so that RF arching and/or voltage breakdown between the electrodes 202, 204 may be inhibited. As the first and second wall members 210, 212 are formed from a dielectric material and the inner volume 218 is at atmospheric conditions (also dielectric), the combination results in a capacitive structure.

The first and second electrodes 202, 204 receive a source of alternating current (AC) power from the RF power source 130 and impedance matching network 140. The RF power has characteristics sufficient to produce an alternating electric field in the Z direction between the electrodes 202, 204 and through the inner volume 218 sufficient to assist in the production of the plasma plume 220 within the plasma containment vessel 200. The RF power may be at a frequency of 2 MHz, 4 MHz, 13.56 MHz, 27 MHz, and 60

MHz (or other suitable frequency), and may be at a power level from 5 kW to 100 kW (or other suitable power level).

Figure 5:
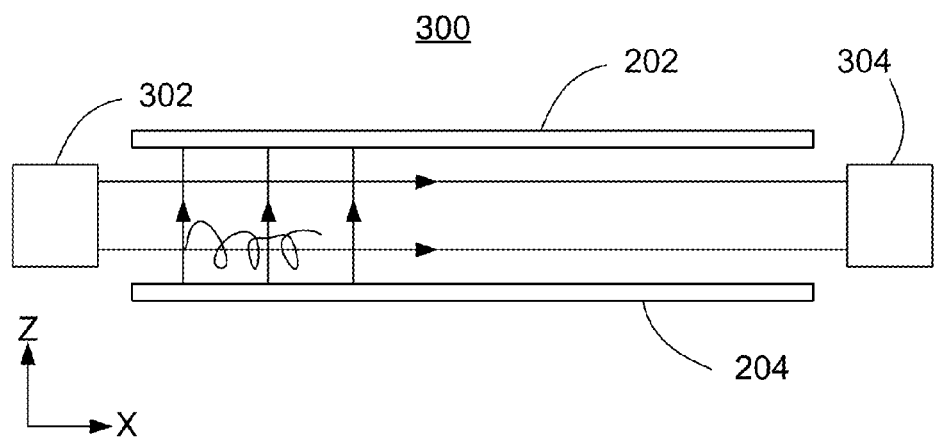
FIG. 5 is a schematic illustration of a top view of a magnetic system suitable for use in implementing the system of FIG. 1 and/or other embodiments.
Figure 6:
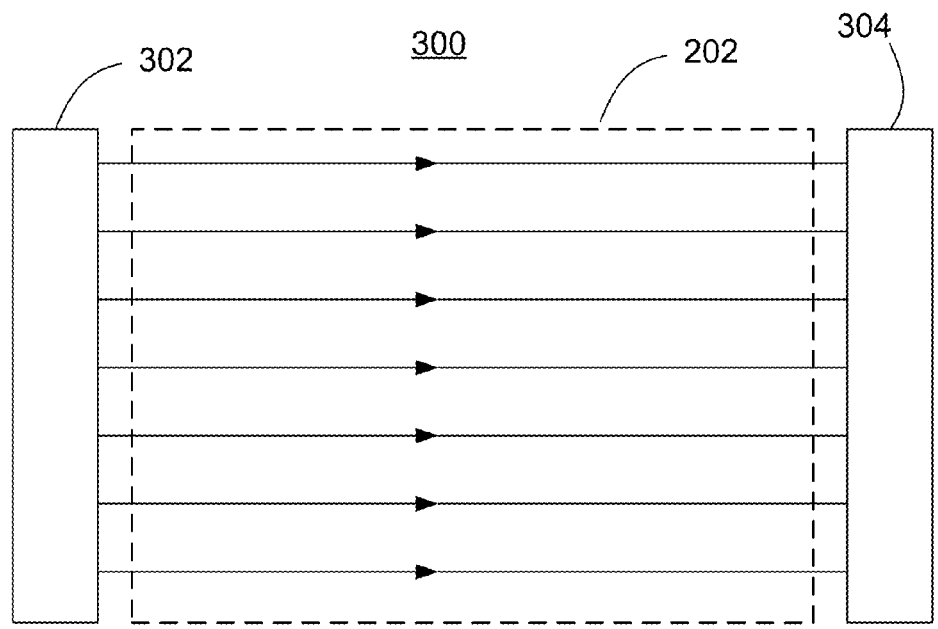
FIG. 6 is a schematic illustration of a side view of the magnetic system of FIG. 5.

The magnetic source 60 operates to produce a magnetic field within the inner volume 218 of the plasma containment vessel 200 of sufficient characteristics to interact with the electric field and produce the plasma plume 220. In this regard, reference is made to FIGS. 5-6, where FIG. 5 is a schematic illustration of a top view of a magnetic system 300 suitable for use in implementing the aforementioned magnetic source 60, and FIG. 6 is a schematic illustration of a side view of the magnetic system 300 of FIG. 5. The magnetic system 300 includes first and second pole pieces 302, 304, where pole piece 302 is considered magnetic North (N) and pole piece 304 is considered magnetic South (S). Thus, the lines of magnetic flux run from the first pole piece 302 to the second pole piece 304. The first and second pole pieces 302, 304 are preferably of a columnar configuration (at least with respect to the first and second electrodes 202, 204), such that the lines of magnetic flux are directed through the inner volume 218 of the plasma containment vessel 200 in the X direction. In other words, the first and second pole pieces 302, 304 may be oriented such that the plurality of lines of magnetic flux are directed in the X direction and parallel with the respective X-Y planes of the first and second electrodes 202, 204.

In this configuration, the electric field and the magnetic field interact to produce the plasma plume 220. In particular, the first and second electrodes produce an electric field having lines of electric flux emanating from one of the first and second electrodes 202, 204 toward the other of the first and second electrodes 202, 204 in the Z direction, where such flux reverses periodically in accordance with the frequency of the RF power. The lines of magnetic flux are generally transverse to the lines of electric flux. At sufficient magnitudes, the interaction of the electric field and the magnetic filed causes an electron cyclotron frequency of electrons (about the lines of magnetic flux) of sufficient magnitude to produce the plasma plume 220. Importantly, the plasma plume 220 produced in this way exhibits sufficient thermal energy to cause the glass batch material 10 to thermally react.

At appropriate magnitudes of the electric field and the magnetic field, the electrons of the plasma gas spiral around the lines of magnetic flux via the Lorentz force and electron cyclotron resonance (ECR). The weak magnetic field lines are linked from the migration of charges between the electrodes 202, 204 when the electric field reverses and the magnetic field captures the migrating electrons. The electrons move at a very high frequency around the magnetic field lines as denoted by the spiral in FIG. 5, which may reach $6.22 \times 10^8$ radians/second, assuming a magnetic field strength of about $3.6 \times 10^{-3}$ Tesla. This frequency may be computed as follows: $w_{ce} = eB/m = (1.602 \times 10^{-19} \text{ C}) * (3.6 \times 10^{-3} \text{ T}) / 9.11 \times 10^{-31} \text{ kg} = 6.22 \times 10^8$ radians/second.

It has been determined that that a suitable electron cyclotron frequency would include at least one of: (i) at least about $2.0 \times 10^8$ radians/second, (ii) at least about $3.0 \times 10^8$ radians/second, and at least about $4.0 \times 10^8$ radians/second. In order to achieve such electron cyclotron frequencies it has been determined that the magnitude of the magnetic field may be at least one of: (i) at least about $2.0 \times 10^{-3}$ Tesla, (ii) at least about $3.0 \times 10^{-3}$ Tesla, and (iii) at least about $4.0 \times 10^{-3}$ Tesla. Such conditions may produce a plasma plume 220 having a core temperature ranging from at least one of: (i) about 9,000° K to about 18,000° K; (ii) about 11,000° K to about 15,000° K; and (iii) at least about 11,000° K. Although the core of the plasma plume 220 may be, for example, 11,000° K or more, the outer edge of the plasma plume 220 may be on the order of about 300° K. Notably, however, the plasma plume 220 is advantageously at atmospheric pressure, whereby the plasma plume 220 may be characterized as an atmospheric pressure thermal plasma jet.

As may be seen in FIG. 3, the first and second wall members 210, 212, the first and second side members 214, 216, and the inlet structure 230 create a five-sided enclosure. The outlet end of the plasma containment vessel 200 may be left open to permit egress of the thermally treated glass batch material 12 by gravity feed. In one or more embodiments, however, the outlet end of the plasma containment vessel 200 may include an opening structure 400 in order to controllably open and close the outlet end, such as during ignition. The opening structure 400 may include a gate 402 that is movable in response to a controller 404. The gate 402 (which may be formed from ceramic material), and any associated elements that may be in sufficient thermal communication with the plasma plume 220, may be water cooled to withstand the high heat absorption as the plasma plume 220 is being developed.

In order to ignite the plasma gas at atmospheric pressure, the gate 402 may be closed and a vacuum may be drawn within the inner volume 218 of the plasma containment vessel 200. Next, argon may be introduced (e.g., to approximately 10 Torr) into the inner volume 218 and then the RF power may be applied to the electrodes 202, 204. The argon should self-ignite under the RF electric field (and magnetic field) and the argon may be employed to take the plasma to a suitable electron temperature (such as at least about 1 eV). After the plasma plume reaches a sufficiently high temperature, nitrogen may be introduced and the initiated plasma plume 220 dissociates the molecular bonds between the two nitrogen atoms. The purpose of adding nitrogen atoms to the plasma gas is to increase thermal conduction of the plasma gas, which in turn allows more process particle heating at a faster rate. Additionally or alternatively, oxygen may be introduced in relatively small amounts if there is a desire to burn off excess carbon (as may be the case when there are polymer elements in the batch materials). The conditions for facilitating the plasma plume are continued until atmospheric pressure is obtained within the volume 218 and the plasma plume 220 is fully achieved. The gate 402 may then be withdrawn once the pressure in the inner volume 218 is equalized. Alternatively, the gate 402 may be eliminated when the plasma containment vessel 200 itself is in a vacuum tight environment.

Figure 7:
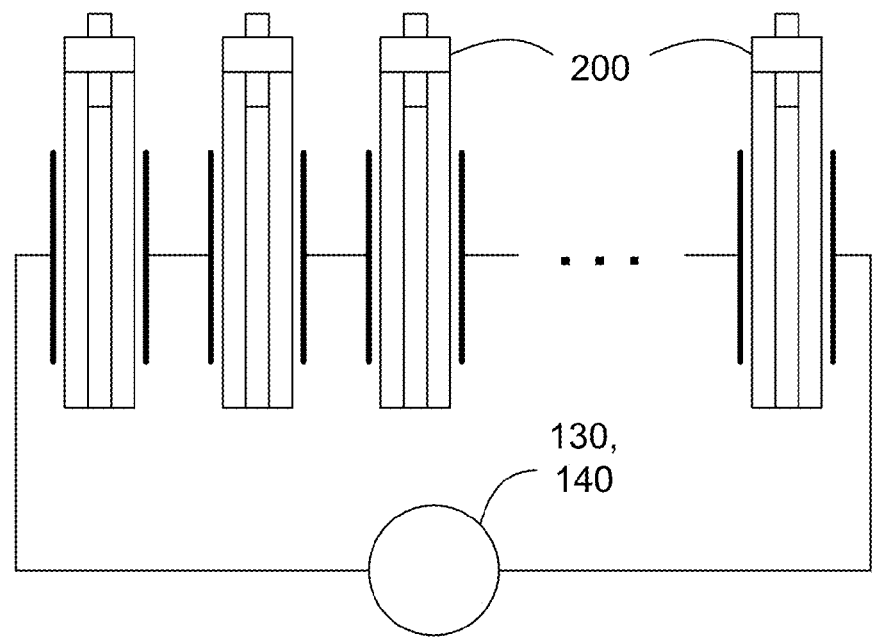
FIGS. 7 and 8 are schematic illustrations of a plurality of plasma containment vessels of FIG. 2 in a series connection for manufacturing scalability.
Figure 8:
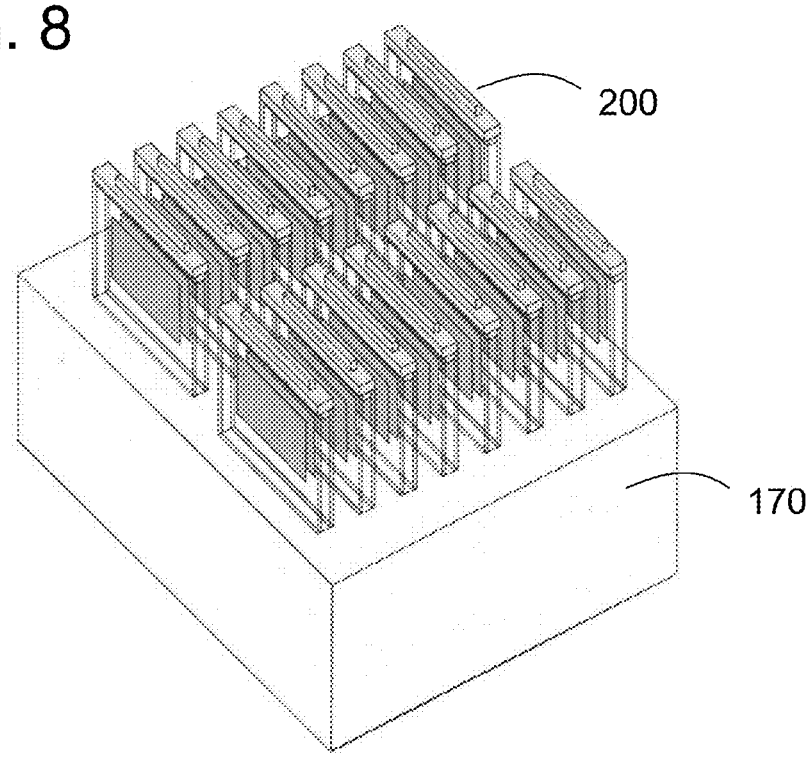

The system 100 may be scaled in order to achieve manufacturing objectives, such as increasing processing volume and rates. FIGS. 7 and 8 are schematic illustrations of a plurality of plasma containment vessels 200 connected together for manufacturing scalability. Since each plasma containment vessel 200 exhibits the characteristics of a capacitor, the plasma containment vessels 200 may be connected in series and/or parallel. For example, in the illustrations of FIGS. 7 and 8, sixteen plasma containment vessels 200 may be connected in series in order to obtain a certain throughput. Although not shown, respective sets of such series coupled plasma containment vessels 200 may be connected in parallel to multiply material capacity (and to also multiply the capacitance of the combination).

Figure 9:
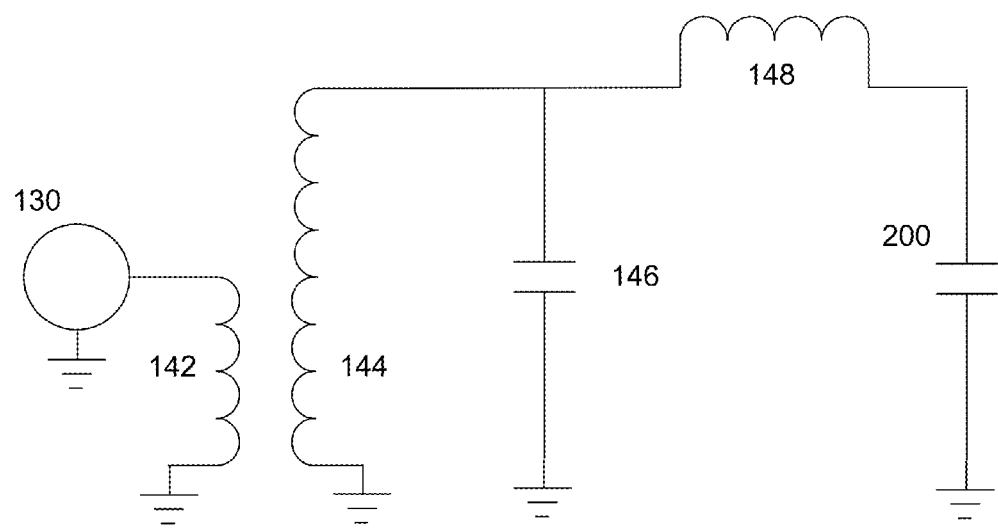
FIG. 9 is a schematic circuit diagram of a system employing the plurality of plasma containment vessels of FIG. 7.

FIG. 9 is an illustration of an equivalent circuit of the sixteen series coupled plasma containment vessels 200 (shown as one equivalent capacitor 200), including the RF power source 130 and the impedance matching network 140. The illustration and the description provided below represent but one example of a suitable implementation of the system. The RF power source 130 may produce 13.56 MHz RF power (707.1 V RMS at 10 KW, and 50 ohms impedance). The impedance matching network 140 may include an input transformer having a primary side winding 142 and a secondary side winding 144 arranged in a voltage step-up configuration. The primary side winding 142 receives the RF power from the RF source 130 and may draw 14.14 A RMS of current, while the secondary side winding 144 may source 0.625 A RMS of current (16 KV RMS at 10 KW, and 25,606 ohms impedance). A shunt capacitance 146 may be 0.26 pF (capacitive impedance of 45,142.7 ohms). A series output inductance 148 may be 10.6 uH (inductive impedance of 903.12 ohms). Each of the sixteen plasma containment vessels 200 may exhibit a capacitance of about 130 pF (capacitive impedance of 90.3 ohms). Thus, the series-coupled network of sixteen plasma containment vessels 200 may exhibit a capacitance of 8.1 pF (capacitive impedance of 1445 ohms).

Each of the plasma containment vessels 200 may produce a 230 mm×230 mm×5 mm plasma plume 220 and may be capable of processing about 179.4 grams of glass precursor material 10 per minute. In comparison, a conventional inductively coupled columnar plasma plume system (which produces a plasma plume of about 5 mm diameter) may only process about 3.9 grams per minute. This is computed as follows. The conventional system is assumed to process a single column of material approximately 5 mm in diameter at a free fall rate of 9.8 m/s$^2$ due to gravity. Assuming a height of about two meters, the distance from the start of the plasma envelope to the rest position would be 0.1 m and the plasma would have a length of 0.1 m. The particles would encounter the plasma at t=0.14 s and exit the plasma at t=0.20 s. The total residence time would be 0.06 s (neglecting gas resistance and downward acceleration due to the gas jets). Assuming a columnar volume of 10 cm in length and a columnar diameter of 0.5 cm, the volume would be 1.96 cm$^3$. The particle distribution would be a bell shaped curve ranging between 50 um and 150 um in which the majority of particles would be close to 100 um in diameter. The volume of a 100 um particle would be $4/3*\pi*(50\times10^6$ m$)^3$=(5.24×10$^{-13}$ m$^3$)*(1×10$^6$ cm$^3$/1 m$^3$)=5.24×10$^{-7}$ cm$^3$. The space that each particle would take up is assumed to be cubed since each particle would touch every other particle at a widest point, yielding a volume of s 1.0×10$^{-6}$ cm$^3$. A total number of particles within the material column space would be 1.96 cm$^3$/1.0×10$^{-6}$ cm$^3$=1,960,000 particles. Assuming the particles would not be tightly packed and would be spread out by approximately 3 volume units by the dispersion of the fluidized particle feed (i.e., one particle for every 3×3×3=27 volume units), the resultant particle count would be 1/27 or 1,960,000/27 or 72,593 particles. The mass of each particle would be approximately 4.3×10$^{-6}$ g. The total mass of 72,593 particles in the plasma at any one time would be 3.12×10$^-$g. This mass would be transitioned through the plasma in 0.06 s, yielding 3.12×10$^{-1}$ g/0.06 s=5.2 g/minute.

Although the disclosure herein has been described with reference to particular embodiments, it is to be understood that these embodiments are merely illustrative of the principles and applications of the embodiments herein. It is therefore to be understood that numerous modifications may be made to the illustrative embodiments and that other arrangements may be devised without departing from the spirit and scope of the present application.

The invention claimed is:

1. An apparatus, comprising:
    a plasma containment vessel having at least first and second opposing wall members defining an inner volume of X, Y, Z orthogonal dimensions and directions, an inlet end, and an opposing outlet end separated from the inlet end in the Y direction;
    an inlet structure disposed at the inlet end of the plasma containment vessel and including: (i) a material inlet for receiving glass batch material, and an opposing material outlet, where the material inlet and the material outlet are elongate in the X direction such that the glass batch material is dispensed as a substantially planar sheet of glass batch material particles into the inner volume of the plasma containment vessel, (ii) at least one gas inlet for receiving one or more sources of plasma gas, and (iii) a plurality of gas outlets disposed in a linear arrangement around a periphery of the material outlet, each of the plurality of gas outlets including at least one bore extending from the at least one gas inlet to the periphery of the material outlet, and the gas outlets for directing the plasma gas into the inner volume of the plasma containment vessel; and
    first and second electrode plates covering portions of respective exterior surfaces of the first and second wall members of the plasma containment vessel, wherein:
    the first and second electrode plates are operable to receive a source of alternating current (AC) power having characteristics sufficient to produce an alternating electric field in the Z direction, and facilitate production of a plasma plume within the plasma containment vessel,
    the plasma plume is of a substantially planar sheet shape having dimensions sufficient to envelope the planar sheet of glass batch material particles, and is of sufficient thermal energy to cause the glass batch material to thermally react.

2. The apparatus of claim 1, wherein the plasma plume is of sufficient thermal energy to cause thermal reaction of sufficient characteristics to at least one of:
    at least partially melt the glass batch material,
    at least partially melt at least one of the glass batch material and one or more further materials thereby forming coated glass batch material particles, and
    at least partially melt the glass batch material to form substantially homogeneous, spheroid-shaped glass intermediate particles.

3. The apparatus of claim 1, wherein:
    the material outlet includes at least first and second opposing peripheral edges extending in the X direction in which the material outlet is elongate; and
    the plurality of gas outlets are disposed at intervals along at least one of the first and second opposing peripheral edges of the material outlet, and are operable to direct the plasma gas into the inner volume of the plasma containment vessel as at least one planar sheet of plasma gas.

4. The apparatus of claim 3, wherein the plurality of gas outlets are disposed at intervals along both of the first and second opposing peripheral edges of the material outlet, and are operable to direct the plasma gas into the inner volume of the plasma containment vessel as two planar sheets of plasma gas.

5. The apparatus of claim 4, wherein the plurality of gas outlets are directed at an angle with respect to the Y direction such that the two planar sheets of plasma gas are directed both in the Y direction and toward one another in order to envelop the planar sheet of glass batch material particles.

6. The apparatus of claim 1, further comprising:
    a magnetic source operating to produce a magnetic field characterized by a plurality of lines of magnetic flux directed through the inner volume of the plasma containment vessel in the X direction, wherein the first and second electrode plates are oriented in respective planes that are parallel to a reference X-Y plane extending in the X and Y directions, and the plurality of lines of magnetic flux are directed in the X direction and parallel with the reference X-Y plane.

7. The apparatus of claim 6, wherein:

at periodic instances of time, the first and second electrode plates produce respective electric fields, each electric field being characterized by lines of electric flux emanating from one of the first and second electrode plates toward the other of the first and second electrode plates in the Z direction, and the interaction of the electric flux and the magnetic flux is such that an electron cyclotron frequency of electrons about the magnetic flux is produced of sufficient magnitude to produce the plasma plume of sufficient thermal energy to cause the glass batch material to thermally react.

8. The apparatus of claim 6, wherein the magnetic field is one of: (i) at least about $2.0 \times 10^{-3}$ Tesla, (ii) at least about $3.0 \times 10^{-3}$ Tesla, and (iii) at least about $4.0 \times 10^{-3}$ Tesla.

9. The apparatus of claim 7, wherein the electron cyclotron frequency is one of: (i) at least about $2.0 \times 10^8$ radians/second, (ii) at least about $3.0 \times 10^8$ radians/second, and at least about $4.0 \times 10^8$ radians/second.

10. The apparatus of claim 1, wherein the plasma plume has a temperature ranging from one of: (i) about 9,000° K to about 18,000° K; (ii) about 11,000° K to about 15,000° K; and (iii) at least about 11,000° K.

11. The apparatus of claim 1, wherein the first and second opposing wall members include respective internal channels operating to carry fluid therethrough in order to cool the plasma containment vessel in the presence of the plasma plume.

12. The apparatus of claim 1, wherein the inlet structure includes one or more internal channels operating to carry fluid therethrough in order to cool the inlet structure in the presence of the plasma plume.

13. The apparatus of claim 1, wherein the inlet opening is of a construction capable of receiving the glass batch material having an average particle size ranging from about 5 to about 1,000 microns.

14. The apparatus of claim 1, wherein the plasma gas includes at least one of argon, air, helium, nitrogen, oxygen, and mixtures thereof.

15. The apparatus of claim 1, wherein the thermally reacted glass batch material exit the plasma containment vessel through the outlet end.

* * * * *